United States Patent [19]

Yoshino et al.

[11] 4,302,687
[45] Nov. 24, 1981

[54] SEMICONDUCTOR SWITCH

[75] Inventors: Tetsuo Yoshino; Tsuyotake Sawano; Tokuo Takeuchi, all of Tokyo, Japan

[73] Assignee: Nippon Electric Co., Ltd., Japan

[21] Appl. No.: 31,131

[22] Filed: Apr. 18, 1979

[30] Foreign Application Priority Data

Apr. 20, 1978 [JP] Japan .................. 53-47270
Apr. 20, 1978 [JP] Japan .................. 53-47271
Jul. 6, 1978 [JP] Japan .................. 53-82782

[51] Int. Cl.$^3$ .......................................... H03K 17/72
[52] U.S. Cl. ............................ 307/252 G; 307/252 T; 307/305
[58] Field of Search .......... 307/252 A, 252 D, 252 G, 307/252 T, 305

[56] References Cited

U.S. PATENT DOCUMENTS 3,932,769  1/1976  Pollmeier ..................... 307/252 G
3,959,668  5/1976  Ohhinata et al. ............... 307/252 G
4,015,143  3/1977  Tokunaga et al. .............. 307/252 G
4,039,864  8/1977  Tokunaga et al. .............. 307/252 G Primary Examiner—John Zazworsky
Attorney, Agent, or Firm—Laff, Whitesel & Rockman

[57] ABSTRACT

A semiconductor (preferably a thyristor) switch has characteristics that can be represented by an equivalent circuit including an interconnected pair of opposite conductive types of transistors. The base terminals of these transistors represent anode and cathode gate electrodes of the thyristors. An amplifier which is free from erroneous actions due to the impression of a transitional voltage is connected to an electrode of the thyristor, which corresponds to the base terminal of an equivalent transistor of a first conductive type, in order to supply a gate current. A resistor across the base-emitter junction of an equivalent transistor of a second conductive type has a sufficiently low-resistance value to satisfy a predetermined dv/dt-bearing capacity. Therefore, a sustaining gate current is provided responsive to an amplification of the input to the amplifying means.

1 Claim, 13 Drawing Figures

SEMICONDUCTOR SWITCH

This invention relates to semiconductor switches and, more particularly, to thyristor switches having a critical rate of voltage rise (dv/dt) from an off-state to an on-state—the invention providing a characteristic which gives an improved response without substantially increasing the inflow or outflow of gate current.

From its cutoff state, a thyristor is undesirably switched on if an electric tension is applied between it anode and cathode, with a fast rising voltage variation (dv/dt) per unit of time. The dv/dt value is generally called the critical rate of rise of the switching or off-state voltage or the dv/dt bearing capacity. The greater this dv/dt value in a thyristor, the less likely is an erroneous switching to occur.

Therefore, in the prior art, the dv/dt-bearing capacity of a thyristor was improved by connecting a resistor $R_{GK}$ between the cathode gate terminal and cathode terminal of the thyristor or by reducing the value of an equivalent resistor ($R_{GK}$), through a use of an emitter short-circuiting structure. In the following description, both this resistor $R_{GK}$ and an equivalent resistor are designated a "resistor." However, the current substantially required as the gate trigger current must bypass this resistor and, accordingly, it has to be quite high. Moreover, the return path for this substantial trigger current passes through a control circuit which is connected to the cathode terminal. As a result, an increase in the current flowing through this circuit sometimes has an adverse effect. Especially when a thyristor is used for switching analog signals, such as speech signals, this substantial trigger current is treated as noise, inviting a drop in the overall S/N ratio and a deterioration of signal fidelity.

Furthermore, reducing the resistance value of the resistor $R_{GK}$ would invite an increase in holding current and, consequently, an increase in minimum passable signal current. Therefore, there is an inevitable limit which prevents a further reduction in the resistance value of the resistor $R_{GK}$. This resistance value generally ranges from one to a few kilo ohms, at which the dv/dt-bearing capacity can be no more than a few dozen volts per microsecond. Accordingly, it was difficult to use thyristors in a switching circuit which required a large dv/dt-bearing capacity and which had to transmit low-amperage signals, at high fidelity.

U.S. Pat. No. 3,959,668, issued to I. Ohhinata et al, shows a bidirectional switch using either two oppositely poled thyristor pairs connected in parallel or four-terminal thyristors connected in parallel and poled in the opposite directions. Each of the thyristor pairs includes a cathode gate drive thyristor and an anode gate drive thyristor connected in parallel. Each four-terminal thyristor has a cathode gate and an anode gate. When the load is capacitive or inductive, the switch functions in such a manner that the gate current from at least one of the cathode gate drive circuit and the anode gate drive circuit remains flowing as long as the A.C. signal continuously passes through the thyristors.

However, since it returns to the load or power source, the gate current substantially overlaps the signal reproduced on the load side. Consequently, unless carefully done, an increase of this gate current would impair the fidelity of the signals. Therefore, in the Ohhinata et al patent, it was necessary to set the output current amperages of the cathode gate drive circuit and anode gate drive circuit at a level which keeps this gate current at its minimum required amperage and to use four-terminal thyristors having a high gate sensitivity.

Another way to improve the dv/dt-bearing capacity is disclosed in U.S. Pat. No. 4,015,143, issued to M. Tokunaga et al. This patent shows a semiconductor switch using a PNPN device having a four-layer equivalent construction of PNPN and including an N-type gate and a P-type gate. An active circuit network includes at least one transistor, and constitutes a negative feedback circuit network formed with part of a positive feedback loop in the PNPN switch. The transistor of the active circuit network is connected to divide at least one of the gate currents of the PNPN switch.

However, this Tokunaga et al system has a disadvantage since it uses complex circuitry because its active circuit network is a combination of transistors and diodes which are turned on by a transitional voltage. Especially from the viewpoint of integrated circuit composition, this system is handicapped in terms of chip area and yield rate.

An object of the present invention is to obviate the above-stated disadvantages by combining a thyristor with an amplifying means to provide a switching circuit which is free from erroneous operation owing to an application of a transitional voltage. Here, an object is to provide a semiconductor switch having improved dv/dt-bearing capacity with a circuit which is capable of reducing the resistance value of the resistor $R_{GK}$ inserted between the gate and cathode, without substantially increasing the gate trigger current.

Another object of this invention is to achieve an improvement of the dv/dt-bearing capacity in a semiconductor switch using thyristors connected in parallel and poled in opposite directions, to constitute a bidirectional structure. Yet another object is to avoid increasing the inflow of the gate current into the signal path while enabling a passage of A.C. signals, virtually free from momentary interruptions.

In accordance with the present invention, a semiconductor switch comprises an amplifying means which is connected to the base terminal of a first equivalent transistor of a thyristor. The amplifier is free from erroneous actions which might otherwise occur due to the appearance of a transistional voltage. A resistor is connected in parallel with the base-emitter junction of a second equivalent transistor of the thyristor. The resistor has a sufficiently low-resistance value to satisfy a predetermined requirement on dv/dt-bearing capacity. A gate current is obtained by amplifying the input to the amplifying means.

BRIEF DESCRIPTION OF THE DRAWINGS

A more detailed description of the invention will be given hereunder, referring to the accompanying drawings in which:

FIGS. 9 through 12 are circuit diagrams illustrating seventh through tenth embodiments, respectively, of the present invention.

DESCRIPTION OF THE PREFERRED EMBODIMENTS

Figure 1:
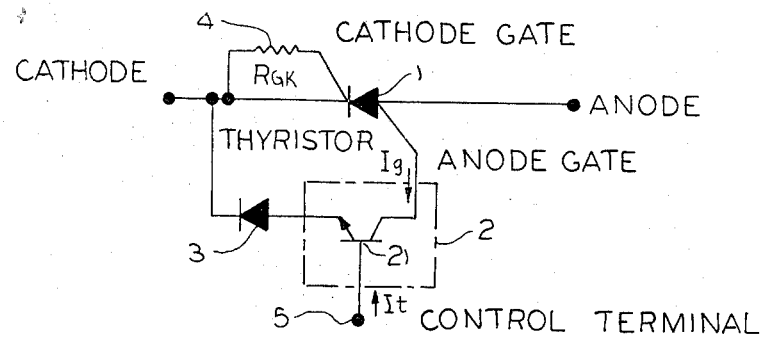
FIG. 1 is a circuit diagram illustrating a first embodiment of this invention.
Figure 2:
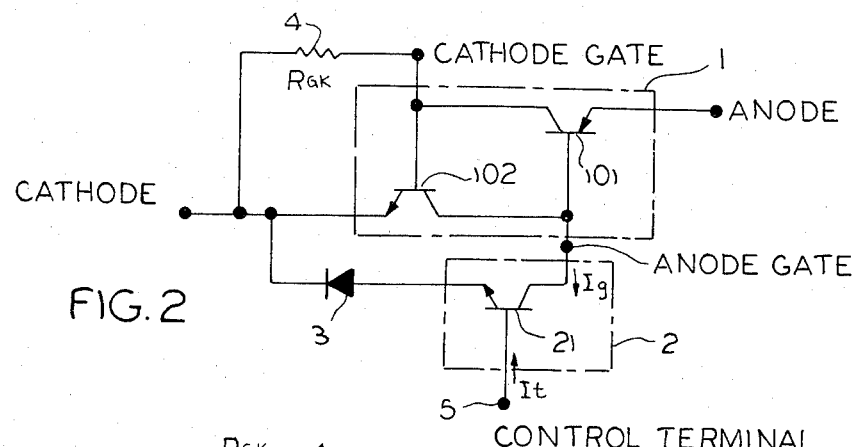
FIG. 2 is a circuit diagram in which the thyristor part of FIG. 1 is represented by an equivalent circuit.

FIG. 1 is a circuit diagram illustrating a first embodiment of this invention in which an NPN transistor 21 is used as amplifying means 2. FIG. 2 illustrates a circuit which is equivalent to that of FIG. 1. In the first embodiment, an NPN transistor 21 is configured as an amplifying means 2 which is free from erroneous operation owing to an impression of a transistional voltage. Its collector is connected to the base of a first conductive type, equivalent transistor 101 (FIG. 2) of a four-terminal thyristor having an anode gate and a cathode gate. One end of a diode 3 is connected to the emitter of the amplifying transistor 21. The other end of the diode 3 is connected to the emitter of an equivalent transistor 102 of the second conductive type. Further, between the base and emitter of the second conductive type of equivalent transistor 102 is connected a resistor $R_{GK}4$ which has a sufficiently low-resistance value to satisfy a given dv/dt requirement, say, around 500 ohms.

Incidentally, the use of a thyristor, or the like, as an amplifying means would invite an erroneous operation of the whole circuit, responsive to a transitional voltage. Consequently, such a thyristor utilization could not achieve the improvement of the dv/dt characteristic, which is the purpose of this invention.

The diode 3 prevents reverse current and a similar diode may be added at a control terminal 5.

In the above-described circuit, a gate trigger is achieved by causing a current of a certain amperage $I_t$ to flow into the control terminal 5. At this time, the gate current $I_g$ to the anode gate of the thyristor 1 is $I_g = K.I_t$, where K is the current amplifying rate of the transistor 21.

Therefore, although the anode gate sensitivity deteriorates with a decrease in the resistance value of resistor $R_{GK}4$ connected between the cathode gate and cathode, the gate trigger requirement can be satisfied even at a low $R_{GK}4$ value because the gate current $I_g$ is multiplied by K, as indicated by the foregoing equation. Thus, if the $R_{GK}4$ resistance value is set to make the thyristor satisfy the desired dv/dt requirement and the current amplifying rate K of the transistor is selected to satisfy the gate requirement, a satisfactory dv/dt characteristic can be obtained without sacrificing the substantial gate sensitivity. Under these conditions, the amperage flowing into the return path connected to the cathode terminal will be $I_t$. The increase in this amperage, owing to the reduction of the $R_{GK}4$ value, can be suppressed, resulting in an elimination of the disadvantage of the prior art. Furthermore, the increase in holding current does not cause a problem if the control current $I_t$ is allowed to flow continuously, as long as the thyristor is switched on.

Figure 3:
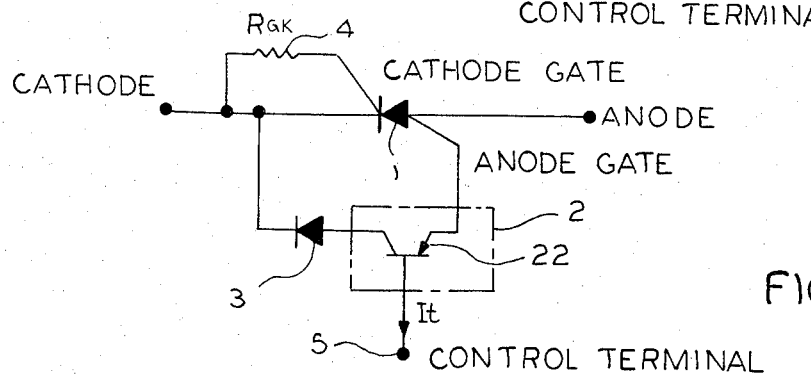
FIGS. 3 through 6 are circuit diagrams illustrating second through fifth embodiments, respectively, of the present invention.

FIG. 3 is a circuit diagram illustrating a second embodiment of the present invention. Herein, a PNP transistor 22 is used as the amplifying means 2. At the control terminal 5, the current flows in the reverse direction as compared to the current flow in the first embodiment. The operation of this embodiment is almost the same as that of the first embodiment.

Figure 4:
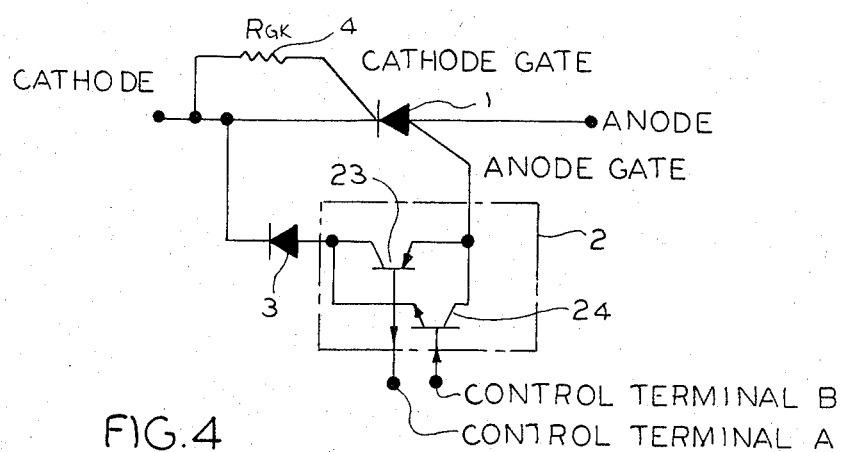

FIG. 4 is a circuit diagram illustrating a third embodiment of this invention, wherein oppositely directed currents are impressed on control terminals A and B. An amplifying means 2 is composed of a PNP transistor 23 and an NPN transistor 24 coupled to make it possible to employ mutually complementary controls.

Figure 5:
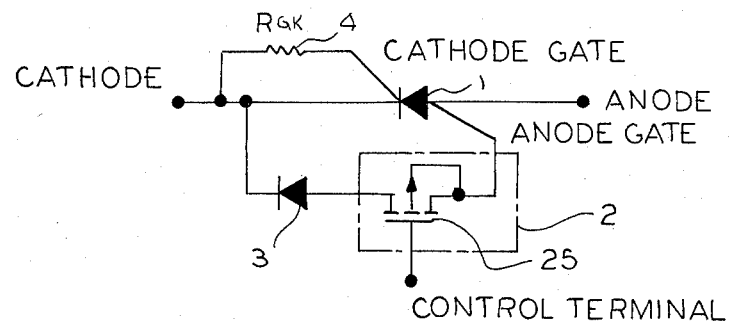

FIG. 5 is a circuit diagram illustrating a fourth embodiment of the present invention, wherein a P-channel MOS FET 25 is used as amplifying means 2. Similarly, though not illustrated, the amplifying means 2 may include an N-channel MOS or a combination of this and other elements.

Figure 6:
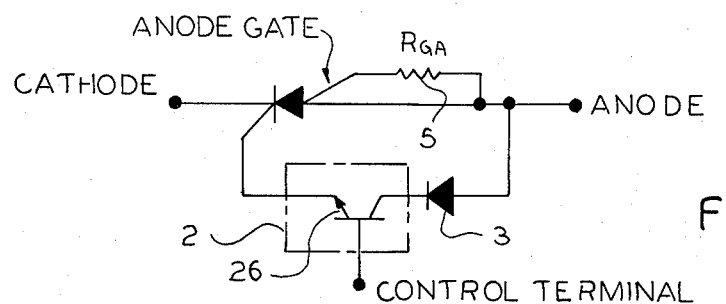

FIG. 6 is a circuit diagram illustrating a fifth embodiment of this invention, wherein a resistor $R_{GA}5$ is inserted between the anode gate and the anode of a four-terminal thyristor 1. An NPN transistor 26 is used as the amplifying means 2, connected between the cathode gate and the anode of thyristor 1.

Figure 13:
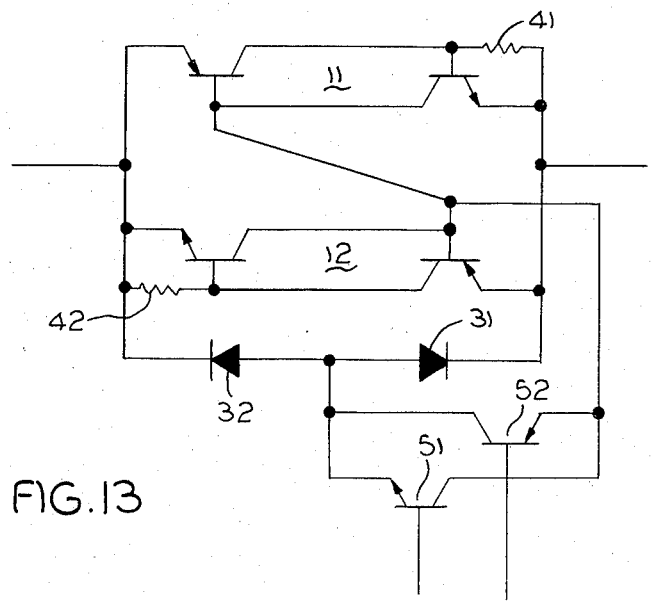
FIG. 13 is an equivalent circuit for two oppositely poled thyristors such as those shown in FIS. 9-12.

Next to be described are remaining embodiments of the present invention, which are bidirectionally constructed by combining a plurality of the units which make up the first to fifth embodiments. An equivalent circuit for this bidirectional construction is found in FIG. 13.

Figure 7:
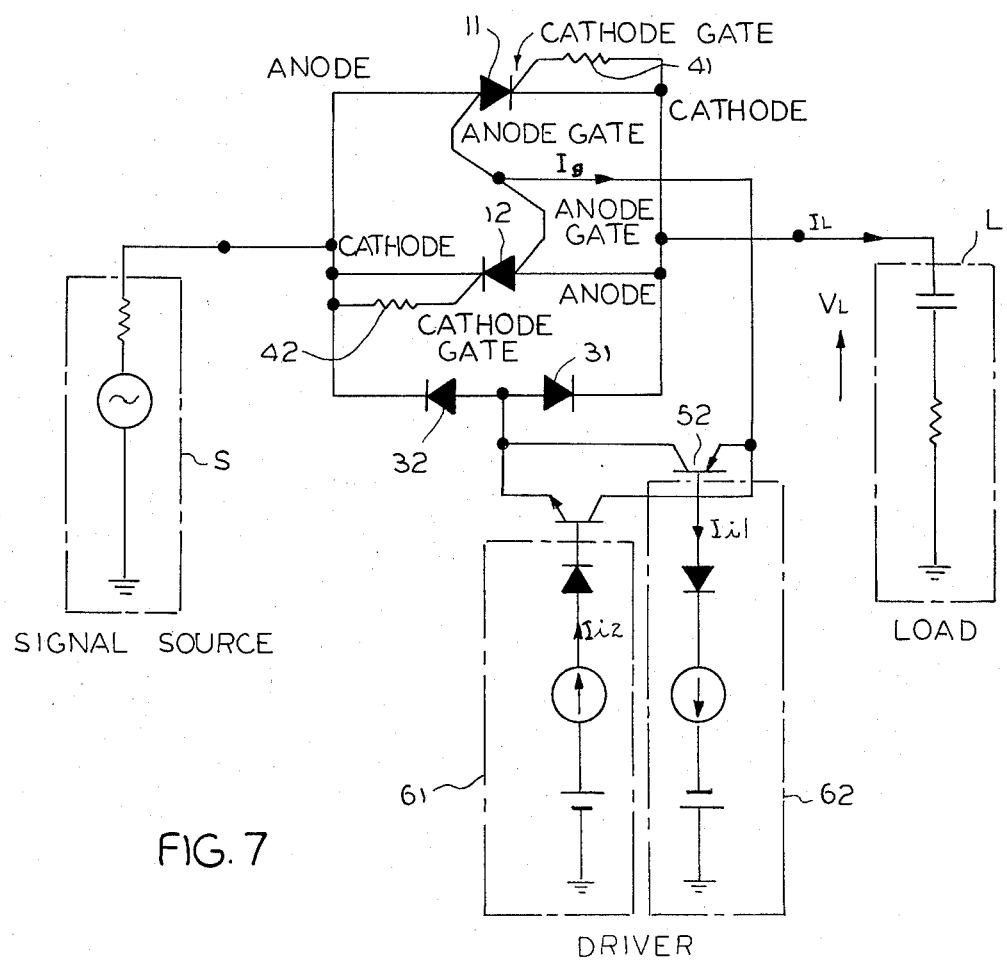
FIG. 7 is a circuit diagram illustrating a sixth embodiment of this invention.

FIG. 7 is a circuit diagram illustrating a sixth embodiment of this invention. Each of the thyristors 11 and 12 can be represented, as illustrated in FIG. 2, by an equivalent circuit including a first conductive-type transistor 101 and a second conductive-type transistor 102. The base terminals (hereinafter called "anode gates") of the first conductive-type, equivalent transistors corresponding to thyristors 11 and 12, are connected in parallel and are poled in opposite directions. These anode gates are commonly connected. A resistor 41 or 42, as the case may be, is connected in parallel with the base-emitter junction (i.e., between the cathode gate and cathode) of each of the two second conductive-type, equivalent transistors. These resistors have a sufficiently low resistance value to satisfy a given dv/dt requirement of, say, 500 ohms or lower. Further, parallel diodes 31 and 32 are connected to the thyristors 11 and 12. In another sense, diodes 31,32 are connected in series and poled in the opposite directions. These diodes 31 and 32 are intended to prevent the current from flowing back to an amplifying means.

A pair of amplifying means 51 and 52 are connected to the junction between the commonly connected anode gates and diodes 31 and 32. These amplifiers amplify currents from driver circuits 61 and 62, respectively, have mutually complementary input characteristics, and are highly resistant to transitional voltages. If the four-terminal thyristors 11 and 12 are switched on, the driver circuits 61 and 62 provide negative or positive voltages, to supply the sustaining gate current which keeps thyristors switched on.

Figure 8:
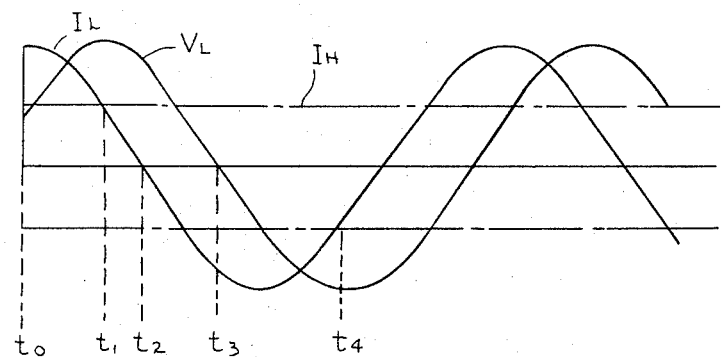
FIG. 8 is a waveform diagram illustrating the relationship between the load current and load voltage in the sixth embodiment illustrated in FIG. 7.

FIG. 8 shows the load current waveform and load voltage waveform when the bidirectional switch of the sixth embodiment, illustrated in FIG. 7, is switched on. An A.C. signal source S is connected to one side and a capacitive load L is connected to the other side of the bidirectional switch. Because the load L is capacitive, the phase of the load current $I_L$ leads the load voltage $V_L$. The dot-dash line $I_H$ represents the holding current for the four-terminal thyristors, which is relatively high because low-resistance values are selected for the resistors 41 and 42.

Next to be described is the operation between times $t_0$ and $t_1$ (FIG. 8), when an input is applied to the driver circuit with the load current $I_L$ being at $t_0$. At this time, the four-terminal thyristor 11 is forwardly blocked and its anode potential is positive; therefore, a gate current is applied by the driven circuit 62. This input current $I_{i1}$ is amplified by the transistor 52, which is an amplifying means. These amplifiers produce a current which is sufficient, but no more, to compensate for the drop in gate sensitivity due to the reduction in the resistance value of the resistor 41. This reduction of resistance occurs responsive to current from the anode gate of the four-terminal thyristor 11. That current returns to the signal path through the diode 31 and, at the same time, to switch on the thyristor 11.

Once the thyristor is switched on, the voltage between both the collector and emitter of the transistor 52 drops, and the action of this transistor 52 stops. However, the thyristor 11 is then in a self-holding state, and there is no obstacle to the passage of signals. During this period, the input current $I_{i1}$ applied to the base of transistor 52 is the only current that flows from the signal source 62 without passing through the load L. The consequential reduction in the resistance of resistor 41 does not cause any deterioration of the signal fidelity.

Next is considered the operation between times $t_1$ and $t_2$ (FIG. 8). At this time, the signal current of the four-terminal thyristor 11 is below the sustaining level $I_H$. Consequently, if uncorrected, thyristor 11 would switch off while the other thyristor 12 is still in a reversely biased state. Therefore, there might be a momentary cutoff if this loss of input current should actually occur. However, because the potentials applied to the thyristors are positive even during this period $t_1$–$t_2$, the input current $I_{i1}$ continues to flow, with a result that the signal current continues to flow in the direction of the anode gate-transistor 52 and diode 31, giving rise to a continuation of signal current, to prevent any momentary cutoff.

Further, during the period from time $t_2$ to time $t_3$, the direction of the current is reversed. Instead, a signal current flows from the anode gate of the thyristor 12 through the transistor 52 and the diode 31. When this signal current reaches a value which satisfies the gate requirement, the thyristor 12 switches on, in a self-holding state and the transistor 52 ceases to act.

During the period from time $t_3$ to time $t_4$, the potentials of the thyristors are negative. The driver circuit 61 is actuated, and an input current $I_{i2}$ flows into the transistor 51. This current $I_{i2}$ is needed to keep the signal current flowing in the direction of the anode gate of the thyristor 12, transistor 51, diode 32, when the thyristor 12 switches on at time $t_4$ and, thereby, prevent momentary cutoffs which might otherwise occur on a loss of input current.

Here, the relationship between the current $I_g$ flowing out of the anode gate of the thyristor and the input current $I_i$, at the moment when the thyristor is about to switch on, is represented by the following equation $$I_g = K \cdot I_i$$

where K is the current amplifying rate of the transistors 51 and 52. Thus, if the resistance values of the resistors 41 and 42 are sufficiently small to satisfy the desired dv/dt requirement and, if the amplifying rate K of the transistors is selected to satisfy the gate requirement, it is possible to improve the dv/dt characteristic without substantially sacrificing the gate sensitivity and without increasing the current flowing into the signal path. There is no deterioration of the signal fidelity. Then, resistors of 500 ohms or lower can be used, resulting in a dv/dt-bearing capacity of 500 V$\mu$S or higher. Further, since the gate current flows regardless of thyristor potentials, a passage of an A.C. signal is possible, virtually without any momentary cutoff, even against a capacitive load.

The foregoing description refers to capacitive loads. Obviously, there are no problems with inductive or resistance loads either.

Figure 9:
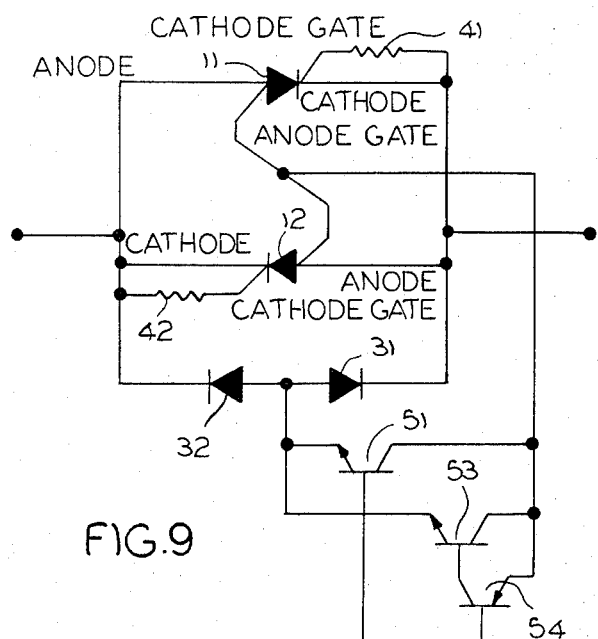

FIG. 9 is a circuit diagram illustrating a seventh embodiment of the present invention. Generally, in integrated circuits, PNP transistors are lateral structures, which do not have large current-amplifying rates. This problem is solved here by a Darlington pairing of a PNP transistor 54 and an NPN transistor 53 to provide an amplifying means which has a greater overall current amplifying rate. This embodiment of FIG. 9 is the same as that of FIG. 7, in other respects.

Figure 10:
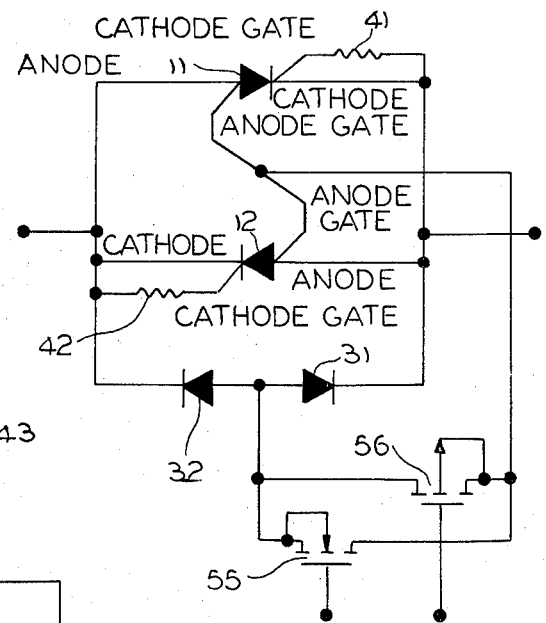

FIG. 10 is a circuit diagram illustrating an eighth embodiment of this invention, in which two MOS/-FET's 55 and 56 are used as amplifying means to achieve the same effect as in the foregoing embodiment.

Figure 11:
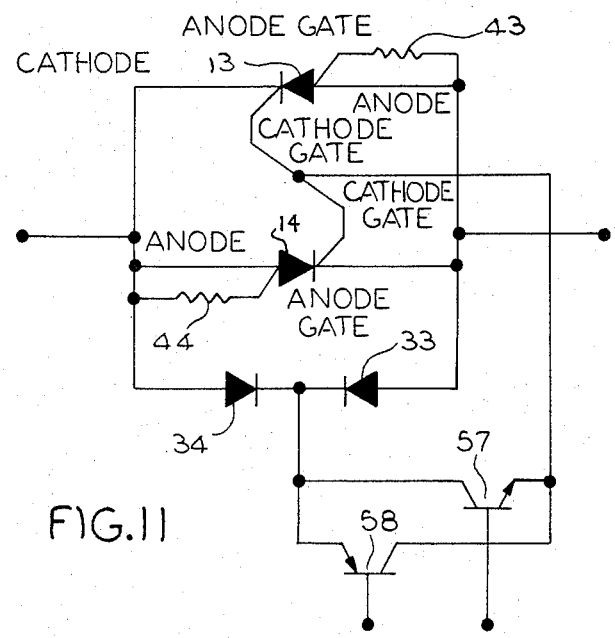

FIG. 11 is a circuit diagram illustrating a ninth embodiment of the present invention. Gate triggering is accomplished by a use of the cathode gates of four-terminal thyristors 13 and 14. Resistors 43 and 44 are inserted between the respective anodes and anode gates to restrain the dv/dt effect. This construction gives essentially the same that is achieved in the foregoing embodiment.

Figure 12:
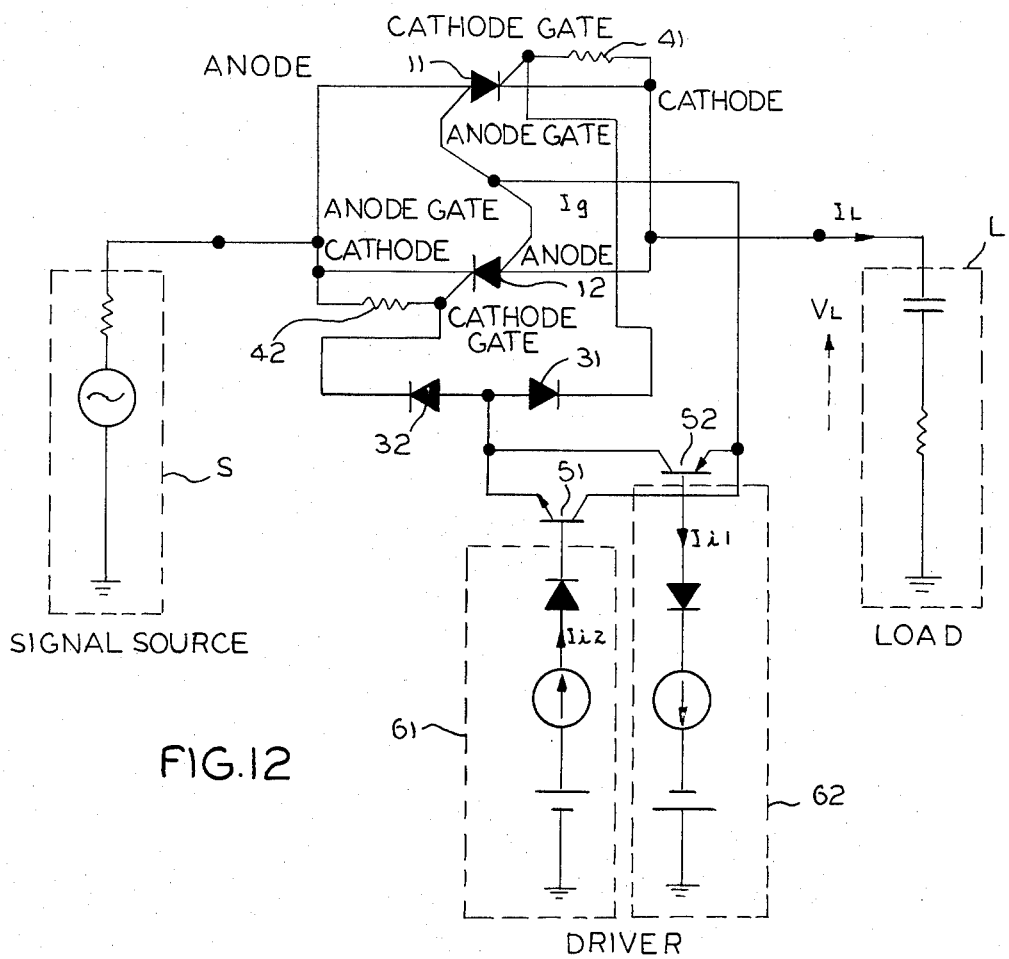

FIG. 12 is a circuit diagram illustrating a tenth embodiment of this invention, which is almost the same as the sixth embodiment illustrated in FIG. 7. However, here, for reverse current preventions, one end of each of the diodes 31 and 32 is directly connected to the base terminal of the second conductive-type, equivalent transistor (i.e., to the cathode gate of the corresponding ones of the thyristors 11 and 12). Therefore, a part of the current $I_g$ flowing out of the anode gate enters the cathode gate, with a result that the gate sensitivity can be further improved, as compared with the gate sensitivity found in the sixth embodiment.

Incidentally, the amplifying means illustrated in FIG. 9 or FIG. 10 can also be used in place of the amplifying means 51 and 52 of this embodiment.

Although the foregoing description referred to circuits based on four-terminal thyristors and external resistors, the resistors may also replace three-terminal thyristors of emitter short-circuiting structure. If four-terminal thyristors, or the like, are used as amplifying means, improvement of the dv/dt-bearing capacity, which is one of the objects of this invention, cannot be achieved because such amplifying means would invite an erroneous response of the entire circuit if an unacceptable transitional voltage should occur.

As hitherto described, the present invention contributes to an improvement of the dv/dt effect by connecting an amplifying means, which is free from erroneous operation due to a transitional voltage, to the base terminal of the first equivalent transistor of the thyristor. The input to the amplifying means is amplified to provide a gate current. A resistor having a sufficiently low resistance value is provided in parallel with the emitter-base junction of the second equivalent transistor. At the same time, the amplifying means prevent an increase in gate current flowing into the circuit to which the thyristor is connected, with a consequential drop in gate sensitivity due to the low resistance value of the resistor.

By constructing the semiconductor switch in a bidirectional form, it is further possible to improve the dv/dt characteristic, restrain the increase of gate current flowing into the signal path and the drop of gate sensitivity, while enabling A.C. signals to pass, virtually without any momentary cutoff, regardless of the character of load impedance. Amplifying means are used with mutually complementary inputs to impress an input or inputs on at least one of the amplifying means as long as signals, are desired to be passed.

Those who are skilled in the art will easily perceive how to modify the system. Therefore, the appended claims are to be construed to cover all equivalent structures which fall within the true scope and spirit of the invention.

What is claimed is:

1. A semiconductor bidirectional switch circuit for passing an AC signal comprising:
   a. a pair of four-terminal thyristors coupled in parallel and poled in the opposite direction, each of said thyristors having a cathode, an anode, and cathode and anode gates, said anode gates being commonly connected;
   b. a pair of diodes coupled in series and poled in opposite directions, one end of each of said diodes being connected to the cathode gate of an individually associated and corresponding one of said thyristors;
   c. resistance means coupled in parallel with the cathode gate and the cathode of the corresponding one of said thyristors;
   d. a pair of amplifying means coupled between each common terminal of said pair of diodes and said anode gates, said pair of amplifying means having a PNP transistor and an NPN transistor connected in parallel;
   e. first driver means including a first current source for supplying a current to the base of said NPN transistor; and
   f. second driver means including a second current source for extracting a current from the base of said PNP transistor; whereby an input to at least one of said pair of amplifying means is maintained to provide a continuous gate current as long as the associated one of said thyristors is switched on.

* * * * *

UNITED STATES PATENT AND TRADEMARK OFFICE
CERTIFICATE OF CORRECTION

PATENT NO. : 4,302,687

DATED : November 24, 1981

INVENTOR(S) : YOSHINO, et al.

It is certified that error appears in the above—identified patent and that said Letters Patent is hereby corrected as shown below:

Col. 1, Line 11, after "between", "it" should be --its--.

Col. 5, Line 4, "driven" should be --driver--.

Col. 5, Line 38, "currentis" should be --current is--.

Signed and Sealed this

Fifteenth Day of June 1982

[SEAL]

Attest:

Attesting Officer

GERALD J. MOSSINGHOFF

Commissioner of Patents and Trademarks